US007265644B2

(12) United States Patent
Floyd et al.

(10) Patent No.: US 7,265,644 B2
(45) Date of Patent: Sep. 4, 2007

(54) ULTRA-BROADBAND INTEGRATED BALUN

(75) Inventors: Brian A. Floyd, Cortlandt Manor, NY (US); Thomas M. Zwick, Kisslegg (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/096,419

(22) Filed: Apr. 1, 2005

(65) Prior Publication Data

US 2006/0220760 A1 Oct. 5, 2006

(51) Int. Cl.
*H01P 5/10* (2006.01)
*H03H 7/42* (2006.01)

(52) U.S. Cl. .......................................... 333/26; 333/33

(58) Field of Classification Search .................. 333/25, 333/26, 33

See application file for complete search history.

(56) References Cited

U.S. PATENT DOCUMENTS 5,523,728 A 6/1996 McCorkle ................... 333/128
6,437,658 B1 8/2002 Apel et al. ..................... 333/26
6,498,540 B2 12/2002 Deckman ..................... 333/26
6,531,943 B2 3/2003 Niu et al. ................... 336/182
6,819,199 B2 * 11/2004 Burns et al. .................. 333/26

OTHER PUBLICATIONS

Zhou et al., "Monolithic Transformers and Their Application in a Differential CMOS RF Low-Noise Amplifier", IEEE Journal of Solid-State Circuits, vol. 33, No. 12, pp. 2020-2027, Dec. 1998.

Jeong et al., "Ultra-wideband (from DC to 110 GHz) CPW to CPS Transition", Electronics Letters, vol. 38, No. 13, pp. 622-623, Jun. 20, 2002.

Prieto et al., "CPS Structure Potentialities for MMICS: A CPS/CPW Transition and a Bias Network", IEEE MTT-S Digest, pp. 111-114, Jun. 1998.

Ho et al., "Broad-Band Uniplanar Hybrid-Ring and Branch-Line Couplers", IEEE Transactions on Microwave Theory and Techniques, vol. 41, No. 12, pp. 2116-2125,Dec. 1993.

* cited by examiner

*Primary Examiner*—Dean Takaoka
(74) *Attorney, Agent, or Firm*—F. Chau & Associates, LLC

(57) ABSTRACT

An ultra-broadband balun is provided. The balun comprises: a first unbalanced transmission line comprising a first ground trace and a signal trace; and a balanced transmission line comprising a first and second signal trace, wherein the first signal trace of the balanced transmission line is connected to the first ground trace of the first unbalanced transmission line and the second signal trace of the balanced transmission line is connected to the signal trace of the first unbalanced transmission line, wherein a first capacitor is disposed in series with one of the first ground trace of the first unbalanced transmission line and the first signal trace of the balanced transmission line.

29 Claims, 10 Drawing Sheets

ULTRA-BROADBAND INTEGRATED BALUN

BACKGROUND OF THE INVENTION

1. Technical Field

The present invention relates to communications systems, and more particularly, to millimeter-wave transmission lines and hybrid couplers.

2. Discussion of the Related Art

A conventional balun is used to convert balanced or differential signals into unbalanced or single-ended signals. Baluns have found increasing use in circuits for millimeter-wave, radio frequency (RF), and high-speed wired applications. The integration of baluns with circuit elements has led to a reduction in power consumption, input/output ports, size and cost of balun-equipped circuits. Moreover, baluns for such circuit integration should be broadband and compact and have a low insertion loss and good return loss.

At low frequencies, for example, 1-5 GHz, integrated baluns are typically implemented using a spiral transformer. Spiral transformers work by exploiting magnetic coupling between inner wound coils of its spiral. The spiral transformer, however, is inherently narrow band due to its non-idealities. For example, the spiral transformer has a coupling factor of less than one, a finite self inductance on the primary and secondary coils and a parasitic capacitance. This leads to parasitics that have to be resonated out, thus limiting the operational bandwidth of the spiral transformer.

At millimeter-wave frequencies, a common way to realize the function of a balun is to use a "rat-race" or ring hybrid coupler. A ring hybrid coupler is typically implemented using three □/4 length transmission lines and one 3□/4 length transmission line all placed in a ring structure. The ring hybrid coupler has bandwidth limitations because the size of the ring structure is determined by the wavelength λ of the desired signal. The ring hybrid coupler does, however, provide common-mode and differential mode ports.

Recently, alternative topologies for baluns have been developed. One alternative topology for a balun is to use a transition from an unbalanced transmission line to a coupled or balanced transmission line. Examples of such back-to-back transitions are shown in FIGS. 1 and 2. As shown in FIG. 1, a balun 110 is connected to another balun 120 via a balanced stripline 130. The balun 110 consists of a portion of a microstrip (μS) transmission line 140, a transition 150 and a portion of the balanced stripline 130. The balun 120 consists of a portion of the balanced stripline 130, a transition 170 and a portion of another μS transmission line 160.

In another back-to-back transition shown in FIG. 2, a balun 205 is connected to a balun 210 via a coplanar stripline (CPS) 215. The balun 205 consists of a portion of a coplanar waveguide (CPW) 220, a transition 225 and a portion of the CPS 215. The balun 210 consists of a portion of the CPS 215, a transition 235 and a portion of another CPW 230. As further shown in FIG. 2, the CPW 220 includes a pair of ground traces 240*a,b* and a signal trace 245*a*, the CPS 215 includes a pair of signal traces 250*a,b* and the CPW 230 includes a pair of ground traces 240*c,d* and a signal trace 245*b*.

In either back-to-back transition of FIGS. 1 and 2, the ground traces, for example, the ground traces 240*a-d*, are connected to the signal trace 250*a* using either a tapered 225, 235 or direct connection. These transitions 225, 235 have been shown to exhibit very broadband behavior. However, in such configurations, a direct current (DC) ground potential is imposed on the signal trace 250*a*. Thus, a differential circuit connected to the CPS 215 would include a DC blocking capacitor inserted between the circuit and the signal trace 250*a* and a dummy capacitor inserted on the signal trace 250*b* to balance the amplitude and phase shifts between the two signal traces 250*a,b*. The inclusion of these capacitors would, however, lead to discontinuities such as an impedance mismatch or insertion loss within the signal traces 250*a,b*.

SUMMARY OF THE INVENTION

The present invention overcomes the foregoing and other problems encountered in the known teachings by providing an ultra-broadband balun.

In one embodiment of the present invention, a balun comprises: a first unbalanced transmission line comprising a first ground trace and a signal trace; and a balanced transmission line comprising a first and second signal trace, wherein the first signal trace of the balanced transmission line is connected to the first ground trace of the first unbalanced transmission line and the second signal trace of the balanced transmission line is connected to the signal trace of the first unbalanced transmission line, wherein a first capacitor is disposed in series with one of the first ground trace of the first unbalanced transmission line and the first signal trace of the balanced transmission line.

The first unbalanced transmission line is one of a microstrip and inverted microstrip. The balanced transmission line is one of a balanced stripline and coplanar stripline. The first capacitor is one of a metal-insulator-metal (MIM) capacitor, vertical parallel-plate capacitor, fringe capacitor, polysilicon capacitor and metal-oxide semiconductor (MOS) capacitor. The first capacitor prevents direct current (DC) ground from being imposed on the first and second signal traces of the balanced transmission line.

The first unbalanced transmission line further comprises a second ground trace, wherein the second ground trace is connected to the first signal trace of the balanced transmission line, wherein a second capacitor is disposed in series with the second ground trace when the first capacitor is disposed in series with the first ground trace. The first unbalanced transmission line is one of a finite-ground coplanar waveguide (FGCPW), coplanar waveguide, coplanar stripline, asymmetric stripline, and slotline.

The first unbalanced and balanced transmission lines are capable of one of millimeter wave transmission and microwave transmission. The second capacitor is one of a MIM capacitor, vertical parallel-plate capacitor, fringe capacitor, polysilicon capacitor and MOS capacitor. The second capacitor prevents DC ground from being imposed on the first and second signal traces of the balanced transmission line. The first unbalanced transmission line and the balanced transmission line have the same impedance.

In another embodiment of the present invention, an ultra-broadband balun circuit, comprises: a first unbalanced transmission line comprising a first ground trace and a signal trace; a balanced transmission line comprising a first and second signal trace, wherein the first signal trace of the balanced transmission line is connected to the first ground trace of the first unbalanced transmission line and the second signal trace of the balanced transmission line is connected to the signal trace of the first unbalanced transmission line, wherein a first capacitor is disposed in series with one of the first ground trace of the first unbalanced transmission line and the first signal trace of the balanced transmission line; a second unbalanced transmission line comprising a ground trace and a signal trace, wherein the signal trace of the second unbalanced transmission line is connected to the first signal trace of the balanced transmission line; and a third unbalanced transmission line comprising a ground trace and a signal trace, wherein the signal trace of the third unbalanced transmission line is connected to the second signal trace of the balanced transmission line.

The first unbalanced transmission line is one of a microstrip and inverted microstrip. The second and third unbalanced transmission lines are each one of an FGCPW, coplanar waveguide, coplanar stripline, asymmetric stripline, microstrip, inverted microstrip and slotline capable of one of millimeter wave transmission and microwave transmission. The balanced transmission line is one of a balanced stripline and coplanar stripline capable of one of millimeter wave transmission and microwave transmission.

A signal output from the second unbalanced transmission line is 180-degrees out of phase with a signal output from the third unbalanced transmission line. An impedance of each of the second and third transmission lines is half an impedance of the first unbalanced transmission or balanced transmission line. Power output from each of the second and third transmission lines is the same.

The first unbalanced transmission line further comprises a second ground trace, wherein the second ground trace is connected to the first signal trace of the balanced transmission line, wherein a second capacitor is disposed in series with the second ground trace when the first capacitor is disposed in series with the first ground trace. The first unbalanced transmission line is one of an FGCPW, coplanar waveguide, coplanar stripline, asymmetric stripline, and slotline. The first and second capacitors are each one of a MIM capacitor, vertical parallel-plate capacitor, fringe capacitor, polysilicon capacitor and MOS capacitor.

The first unbalanced transmission line comprises a primary coil of a first transformer and a capacitor, the balanced transmission line comprises a secondary coil of the first transformer and a primary coil of a second transformer, a primary coil of a third transformer and an inductor, an ultra-broadband balun comprises the first transformer and the capacitor of the first unbalanced transmission line, the second unbalanced transmission line comprises a secondary coil of the second transformer and a capacitor and the third unbalanced transmission line comprises a secondary coil of the third transformer and a capacitor.

In yet another exemplary embodiment of the present invention, an ultra-broadband balun circuit comprises: a first unbalanced transmission line comprising a first ground trace and a signal trace; and a balanced transmission line comprising a first and second signal trace, wherein a first capacitor is disposed in series with the first signal trace and a second capacitor is disposed in series with the second signal trace and a first bias stub is connected to the first signal trace and a second bias stub is connected to the second signal trace, wherein the first signal trace is connected to the first ground trace of the first unbalanced transmission line and the second signal trace is connected to the signal trace of the first unbalanced transmission line.

The first and second bias stubs provide a DC connection to the first and second signal traces of the balanced transmission line. The fist and second bias stubs form a bias-tee. The first unbalanced transmission line is one of a microstrip and inverted microstrip. The balanced transmission line is one of a balanced stripline and coplanar stripline. The first and second capacitors are each one of a MIM capacitor, vertical parallel-plate capacitor, fringe capacitor, polysilicon capacitor and MOS capacitor.

The circuit further comprises a second unbalanced transmission line comprising a ground trace and a signal trace, wherein the signal trace of the second unbalanced transmission line is connected to the first signal trace of the balanced transmission line; and a third unbalanced transmission line comprising a ground trace and a signal trace, wherein the signal trace of the third unbalanced transmission line is connected to the second signal trace of the balanced transmission line.

The second and third unbalanced transmission lines are each one of a FGCPW, coplanar waveguide, coplanar stripline, microstrip, inverted microstrip and slotline. The first unbalanced transmission line further comprises a second ground trace connected to the first signal trace of the balanced transmission line. The first transmission line is one of a FGCPW, coplanar waveguide, coplanar stripline, asymmetric stripline, and slotline.

The foregoing features are of representative embodiments and are presented to assist in understanding the invention. It should be understood that they are not intended to be considered limitations on the invention as defined by the claims, or limitations on equivalents to the claims. Therefore, this summary of features should not be considered dispositive in determining equivalents. Additional features of the invention will become apparent in the following description, from the drawings and from the claims.

DETAILED DESCRIPTION OF EXEMPLARY EMBODIMENTS

Figure 1:
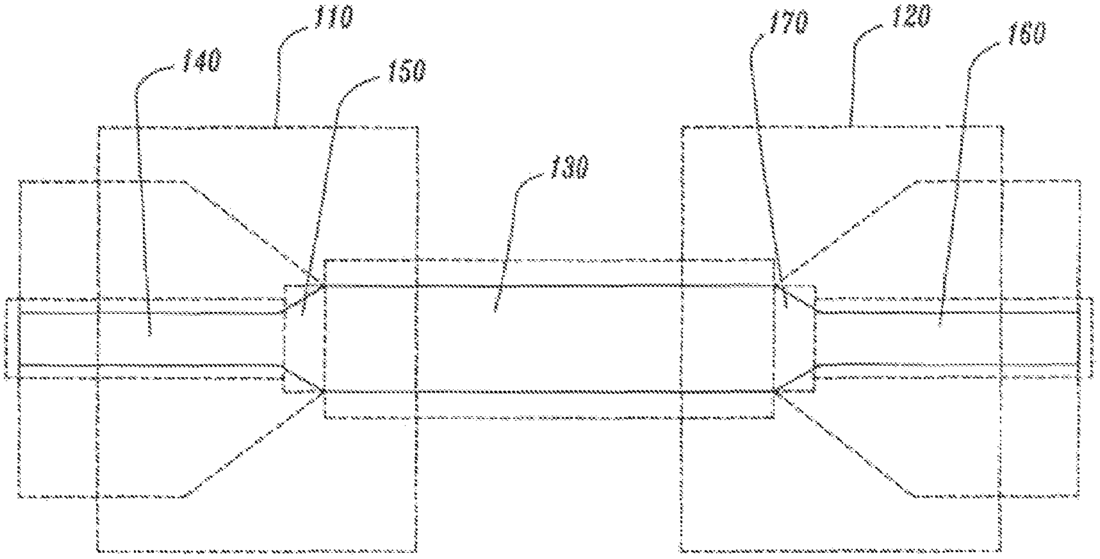
FIG. 1 PRIOR ART
FIG. 1 is a diagram of conventional back-to-back baluns including transitions between an unbalanced microstrip (μS) transmission line and a balanced stripline.
Figure 2:
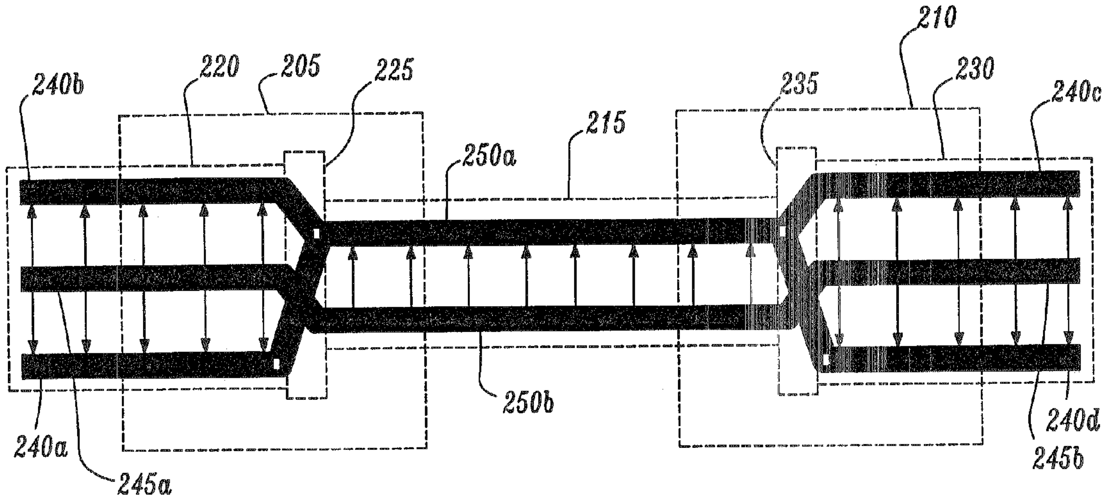
FIG. 2 (PRIOR ART)
FIG. 2 is another diagram of conventional back-to-back baluns including transitions between an unbalanced coplanar waveguide (CPW) and a balanced coplanar stripline (CPS)
Figure 3:
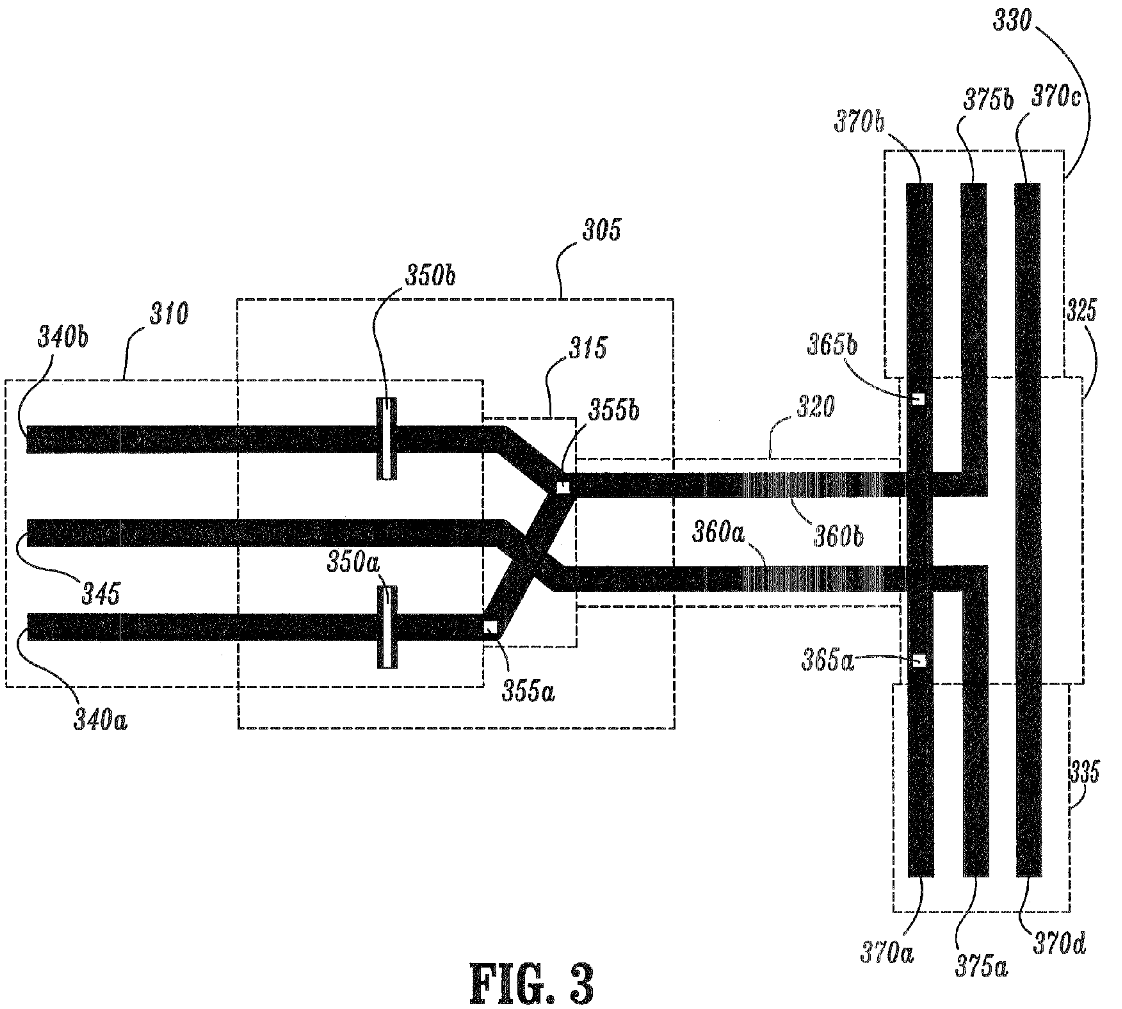
FIG. 3 is a diagram of an ultra-broadband balun structure according to an exemplary embodiment of the present invention.

FIG. 3 is a diagram of an ultra-broadband balun structure according to an exemplary embodiment of the present invention. As shown in FIG. 3, an ultra-broadband balun 305 includes a portion of an unbalanced transmission line 310, a portion of a balanced transmission line 320 and a transition 315 between the unbalanced transmission line 310 and the balanced transmission line 320. The balun 305 also includes a pair of capacitors 350*a,b* connected to the unbalanced transmission line 310.

The unbalanced transmission line 310 includes a pair of ground traces 340*a,b* and a signal trace 345. The capacitors 350*a,b* are inserted in a portion of the ground traces 340*a,b* that are included in the balun 305. The balanced transmission line 320 includes a pair of signal traces 360*a,b*. One of the signal traces 360*a* is connected to the signal trace 345 and the other signal trace 360*b* is connected to the ground traces 340*a,b* through the transition 315 followed by the capacitors 350*a,b*. The transition 315 includes vias 355*a,b* for connecting upper and lower level metal portions of the ground traces 340*a,b*.

As shown in FIG. 3, the balanced transmission line 320 is optionally connected to a pair of unbalanced transmission lines 330 and 335 through a split 325. Transitioning from the balanced transmission line 320 to the unbalanced transmission lines 330 and 335 through the split 325 is necessary and desirable, for example, if balun drives are driven by structures located far apart from one another with respect to the wavelength of a signal traversing the balun 305. The unbalanced transmission line 330 includes a pair of ground traces 370*b,c* and a signal trace 375*b* and the unbalanced transmission line 335 includes a pair of ground traces 370*a,d* and a signal trace 375*a*. The signal trace 375*b* is connected to the signal trace 360*b* and the signal trace 375*a* is connected to the signal trace 360*a*. The split 325 includes vias 365*a,b* for connecting upper and lower level metal portions of the ground traces 370*a,b*.

The unbalanced transmission line 310 is a coplanar waveguide (CPW), the balanced transmission line 320 is a coplanar stripline (CPS) and the unbalanced transmission lines 330 and 335 are CPWs. In other words, the balun 305 and unbalanced transmission lines 330 and 335 are shown having a CPW-to-CPS-to-CPW implementation. It is to be understood, however, that the balun 305 and unbalanced transmission lines 330 and 335 may have any number of implementations based on the type of transmission lines used. For example, in addition to CPW and CPS, the unbalanced and balanced transmission lines 320, 310, 330 and 335 may be finite-ground coplanar waveguide (FGCPW), CPW, CPS, differential CPS, microstrip (μS), inverted μS, asymmetric stripline or slotline transmission line types.

As further shown in FIG. 3, in operation, an unbalanced input signal enters at the left hand side or delta port of the unbalanced transmission line 310 having an impedance $Z_o$ via the signal line 345 and passes to the balanced transmission line 320 also having an impedance $Z_o$ via the transition 315 to the signal trace 360*a*. The ground traces 340*a,b* pass to the signal trace 360*b*. To prevent direct current (DC) ground from being imposed on one of the balanced signal traces 360*a,b* the capacitors 350*a,b* are inserted in series in the ground traces 340*a,b*, respectively. It is to be understood, however, that one or both of the capacitors 350*a,b* could be inserted in the signal trace 360*b* to prevent DC ground from being imposed on one or both of the balanced signal traces 360*a,b*.

The capacitors 350*a,b* may be metal-insulator-metal (MIM) capacitors having a capacitance density of, for example, 1 fF/μm$^2$. However, other types of capacitors such as vertical parallel-plate capacitors, fringe capacitors, polysilicon capacitors and metal-oxide semiconductor (MOS) capacitors having similar densities may be used in accordance with the present invention. The capacitors for use with the present invention are chosen such that they fit easily into the unbalanced transmission line 310 portion of the balun 305 without introducing discontinuities while having a large enough capacitance to not degrade radio frequency (RF) operation of the balun 305.

In addition, the capacitors for use with the present invention should be vertically located in close proximity to a balanced transmission line thus avoiding the need for long vertical interconnects to the capacitors. Further, as these capacitors are located near a balanced transmission line, the parasitic "lead" inductance to the capacitors is low, thereby leading to higher self-resonant frequencies. The size of the capacitors dictate a lower frequency bound for the balun 305. For example, larger capacitors result in a lower frequency bound but also lower self-resonant frequencies, although in some instances, a capacitor may operate beyond its self-resonant frequency. Thus, to lower the operating frequency below 5 GHz a capacitor that operates beyond its self resonance at 60 GHz is needed. However, it will be shown that this does not negatively impact the performance of the balun 305 at millimeter wavelengths.

After the transition 315 from the unbalanced transmission line 310 to the balanced transmission line 320, a length of the balanced transmission line 320 is needed to establish a differential mode of signal propagation. Then the balanced transmission line 320 is split into the two unbalanced transmission lines 330 and 335 by 'peeling' off the two signal traces 360*a,b* and reintroducing the ground traces 370*a,b* as shown by the split 325. As shown in FIG. 3, the balanced transmission line 320 is split into the two unbalanced transmission lines 330 and 335 each having an impedance $Z_o/2$ and signals that are output from the signal lines 360*a,b* exit through the signal lines 375*a,b*. In other words, the output signals leave the balun 305 and exit through the top portion or positive port of the unbalanced transmission line 330 and through the bottom portion or negative port of the unbalanced transmission line 335. These output signals have an equal power split with a 180-degree phase difference, thus enabling the structure of FIG. 3 to be used, for example, as a 180-degree power splitter or a 180-degree power combiner.

Figure 4:
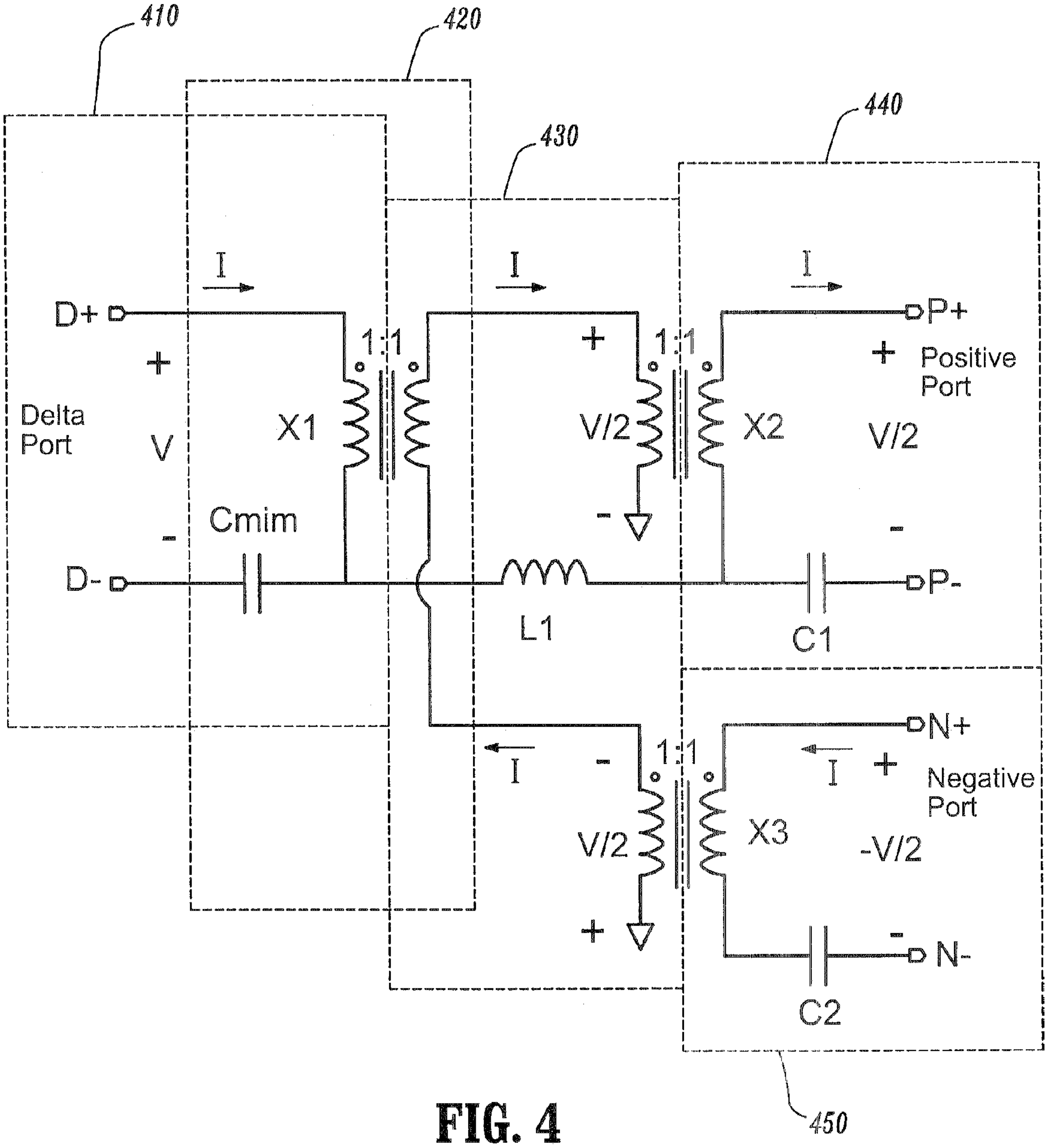
FIG. 4 is a circuit diagram an ultra-broadband balun structure according to another exemplary embodiment of the present invention.

FIG. 4 is an ideal, lossless circuit model of an ultra-broadband balun structure according to another exemplary embodiment of the present invention. As shown in FIG. 4, the ideal circuit includes an unbalanced transmission line 410, an ultra-broadband balun 420, a balanced transmission line 430 and a pair of unbalanced transmission lines 440 and 450. The ideal circuit is presented to illustrate the operation of the balun 420 and to show some of the circuit's voltage and current relationships. The circuit is ideal in that it is lossless and in that there is no phase shift across the balun 420. In other words, this is a lumped representation. It is to be understood, however, that phase shift and loss can be added to the circuit by inserting appropriate transmission line models at certain locations. Moreover, it is to be understood that the circuit is broadband because its transformers X1-X3 are ideal and because its capacitors Cmim, C1 and C2 and an RF inductor L1, which are used for DC blocking and biasing, are large in value.

RF operation of the ideal circuit of FIG. 4 will now be described. First, it is assumed that a voltage V and a current I are applied to a delta port of the circuit and that its positive and negative output ports are equally terminated. Also, assume that the DC blocking capacitors C1 and C2 and inductor L1 are not present by replacing the capacitors C1 and C2 with short circuits and the inductor L1 with an open circuit. An input signal then enters at the delta port and encounters the transformer X1. The transformer X1 is used to model a transition from the unbalanced transmission line 410 to the balanced transmission line 430. The model transformer X1 has a 1:1 turns ratio, thus the currents and voltages through its primary and secondary coils are equal.

As further shown in FIG. 4, the capacitor Cmim is connected to a negative node of the primary coil of the transformer X1. At low frequencies, Cmim leads to a voltage division and an impedance mismatch, and at high frequencies, Cmim behaves as a short circuit. The output of the transformer X1 is sent to the balanced transmission line 430 that is connected to the transformers X2 and X3. The transformers X2 and X3 model the split from the balanced transmission line 430 into the unbalanced transmission lines 440 and 450 both having a 180-degree phase difference.

For example, the transformer X2 is connected to a positive node of the transformer X1's secondary coil, while the transformer X3 is connected to a negative node of the transformer X1's secondary coil. At high frequencies, for example, greater than 20 GHz, where the capacitor Cmim is short, the voltage across a primary coil of the transformer X2 is equal to V/2, while the voltage across a primary coil of the transformer X3 is equal to −V/2. This voltage split results from the series connection of the transformers X2 and X3. This also occurs because the transformers X2 and X3 have 1:1 turns ratios that convey their primary voltages and currents without any gain or loss. Thus, the positive port has a voltage of V/2 and a current of I while the negative port has a voltage of −V/2 and a current of −I. Therefore, it can be observed that the powers at the positive and negative ports are each half the power at the delta port, the signals at the positive and negative ports are 180-degrees out of phase and the impedances at the positive and negative ports are each half the impedance of the delta port.

The DC operation of the balun 420 is also modeled in the ideal circuit of FIG. 4 using the DC blocking capacitors C1 and C2 and the RF choke inductor L1. In the circuit of FIG. 4, a direct connection exists between the delta port and the positive port. This is modeled using the inductor L1. The capacitors C1 and C2 provide an alternating current (AC) ground to the negative nodes of the secondary coils of the transistors X2 and X3, respectively, while preventing the delta, positive and negative ports from being connected to ground at DC.

As further shown in FIG. 3 or 4, the balun 305 or 420 only works with differential-mode signals. Common-mode signals will be reflected by the delta port of the unbalanced transmission line 310 or 410. In addition, there is no center tap such as those included in spiral transformers nor a common-mode input such as those included in ring-hybrid couplers. Thus, for example, if a common-mode signal is applied to the positive and negative ports, a zero voltage difference is observed across the transformer X1's secondary coil. Zero current then flows through the secondary coils of the transformer X1 and the primary coils of the transformers X2 and X3, thus no current flows through the positive or negative ports. Therefore, the balun 305 or 420 acts like an open circuit when a common-mode signal is applied to its positive and negative ports.

Three exemplary embodiments of an ultra-broadband balun will now be described with reference to FIGS. 5-7. These examples differ in terms of the impedances of the transmission lines and the types of transmission lines used. Each balun of FIGS. 5-7 includes a capacitor or capacitors in series between an unbalanced and balanced transmission line. In addition, each balun has a transition to two unbalanced transmission lines whose signals are 180-degrees out of phase.

Figure 5:
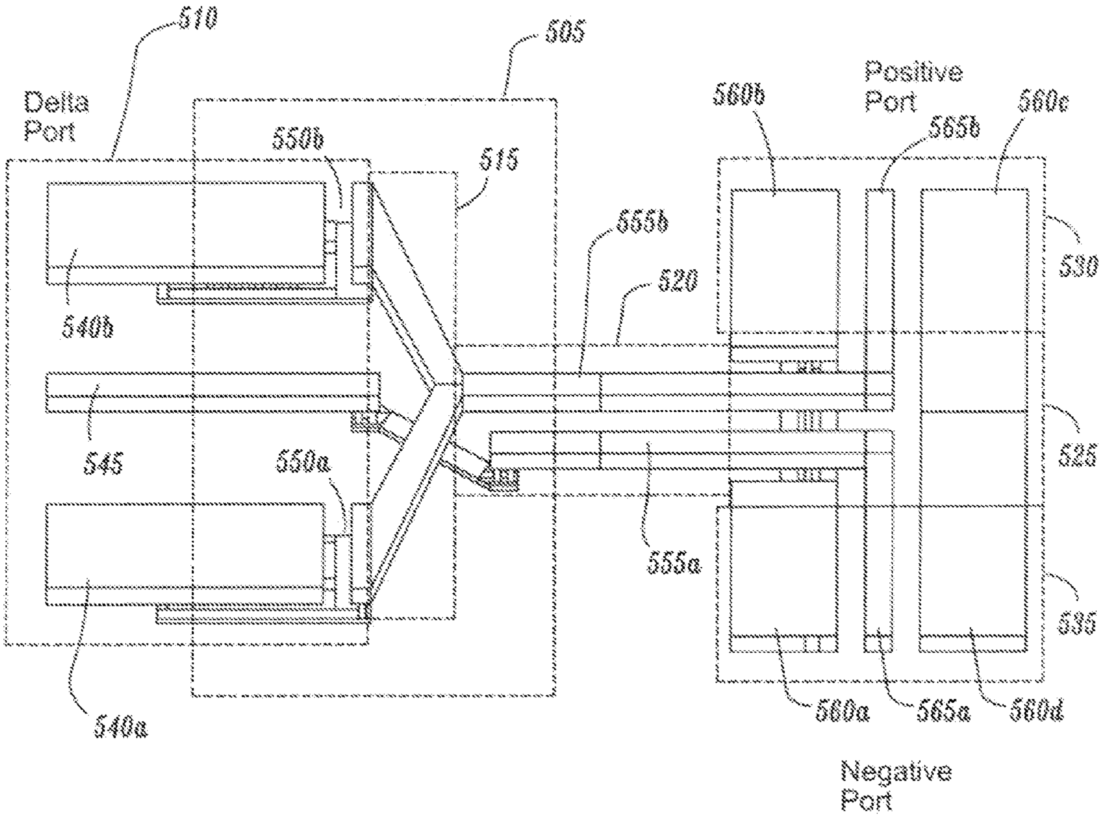
FIG. 5 is a profile view of an ultra-broadband balun structure having a CPW-to-CPS-to-CPW configuration according to yet another exemplary embodiment of the present invention.

FIG. 5 is a profile view of an ultra-broadband balun structure having a CPW-to-CPS-to-CPW configuration. As shown in FIG. 5, an ultra-broadband balun 505 includes a portion of an unbalanced CPW 510, a portion of a balanced CPS 520 and a transition 515. The balun 505 also includes a pair of capacitors 550*a,b* connected to the unbalanced CPW 510. The unbalanced CPW 510 includes a pair of ground traces 540*a,b* and a signal trace 545 and the balanced CPS 520 includes a pair of signal traces 555*a,b*. The balanced CPS 520 is connected to a pair of unbalanced CPWs 530 and 535 through a split 525. The unbalanced CPW 530 includes a pair of ground traces 560*b,c* and a signal trace 565*b* and the CPW 535 includes a pair of ground traces 560*a,d* and a signal trace 565*a*.

As further shown in FIG. 5, a signal is input to the signal trace 545 via a delta port of the unbalanced CPW 510 having an impedance of 100 ohms. The capacitors 550*a,b* each have a value that is roughly 325 fF. After a short length of the balanced CPS 520 having an impedance of 100 ohms, which is long enough to establish a balanced propagation mode, there is the transition or split 525 to the two unbalanced CPWs 530 and 535. The two unbalanced CPWs 530 and 535 each have an impedance of 50 ohms and signals that are output from positive and negative ports thereof are 180-degrees out of phase.

Figure 6:
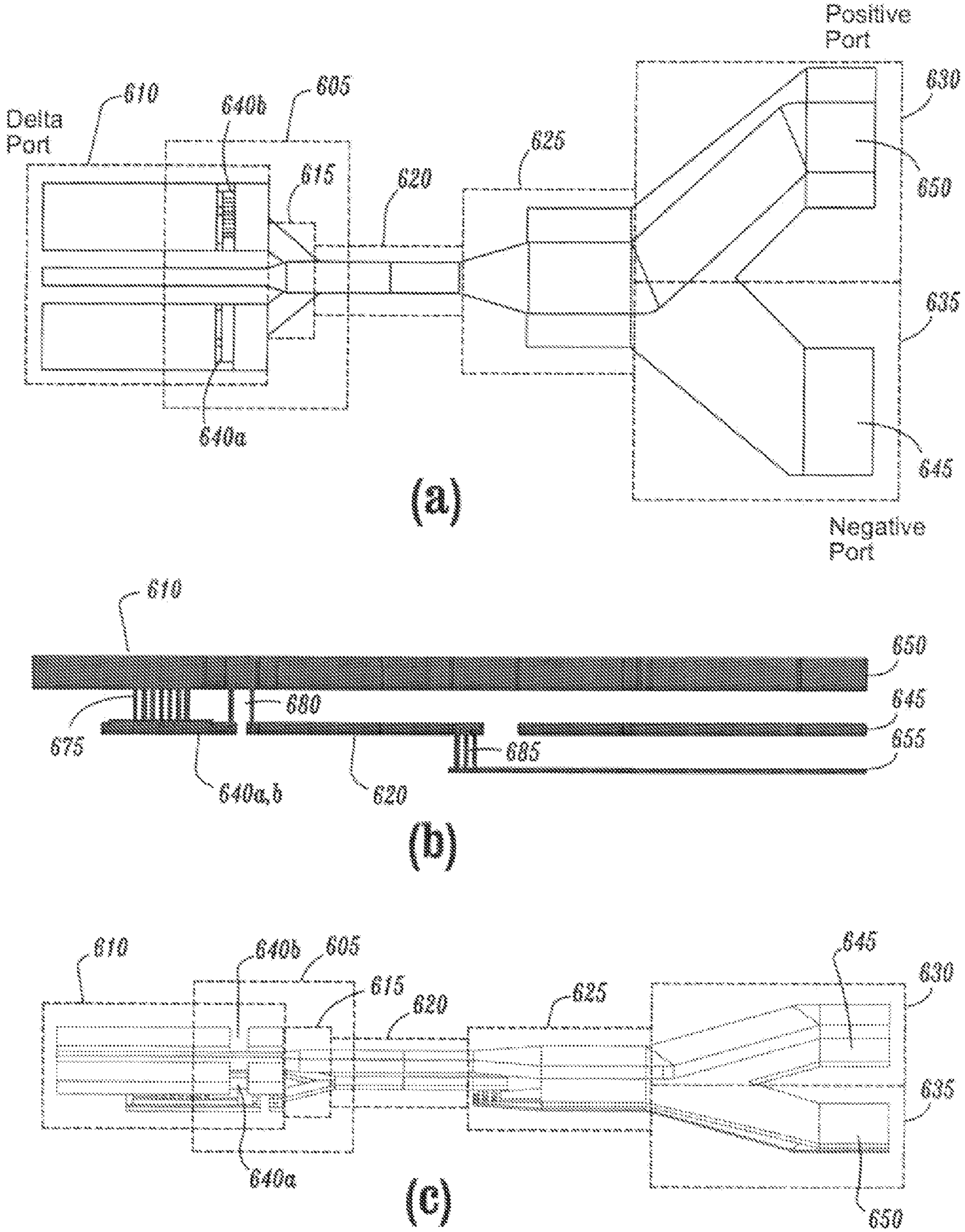
FIG. 6 illustrates a top, side and profile view of an ultra-broadband balun structure having a CPW-to-balanced stripline-to-μS configuration according to an exemplary embodiment of the present invention.

FIG. 6 illustrates a top (a), side (b) and profile (c) view of an ultra-broadband balun structure having a CPW-to-balanced stripline-to-μS configuration. As shown in FIG. 6, an ultra-broadband balun 605 includes a portion of an unbalanced CPW 610, a portion of a balanced stripline 620 and a transition 615. The balun 605 also includes a pair of capacitors 640*a,b* connected to the unbalanced CPW 610. The balanced stripline 620 is connected via split 625 to an unbalanced μS 630 and an unbalanced and inverted μS 635. μS 630 includes a signal trace 650 positioned over the top of a ground plane 645 and the inverted μS 635 includes a signal trace 655 beneath the ground plane 645. Several vias 675, 680 and 685 are highlighted in the side view (b) to illustrate the connections between upper and lower level metal portions of the unbalanced CPW 610, ground plane 645 and signal line 655 of the inverted μS 635, among others.

As further shown in FIG. 6, a signal is input to a signal trace via a delta port of the unbalanced CPW 610 having an impedance of 50 ohms. Then there is the transition 615 to the balanced stripline 620. The balanced stripline 620 consists of two signal lines stacked on top of each other. Similar to that of FIG. 3, two MIM capacitors 640*a,b* are inserted in series with the ground traces of the unbalanced CPW 610. After a short length of the balanced stripline 620, there is the transition or split 625 to the two unbalanced μSs 630 and 635. The unbalanced μSs 630 and 635 each have an impedance of 25 ohms and signals output from positive and negative ports thereof are 180-degrees out of phase. In this implementation, outputs of the unbalanced μS 630 and 635 are inverted with respect to each other. In this manner, the transition or split 625 from the balanced stripline 620 to the μSs 630 and 635 is obtained by inserting a ground plane or trace 645 in between the two signal lines of the balanced stripline 620.

Figure 7:
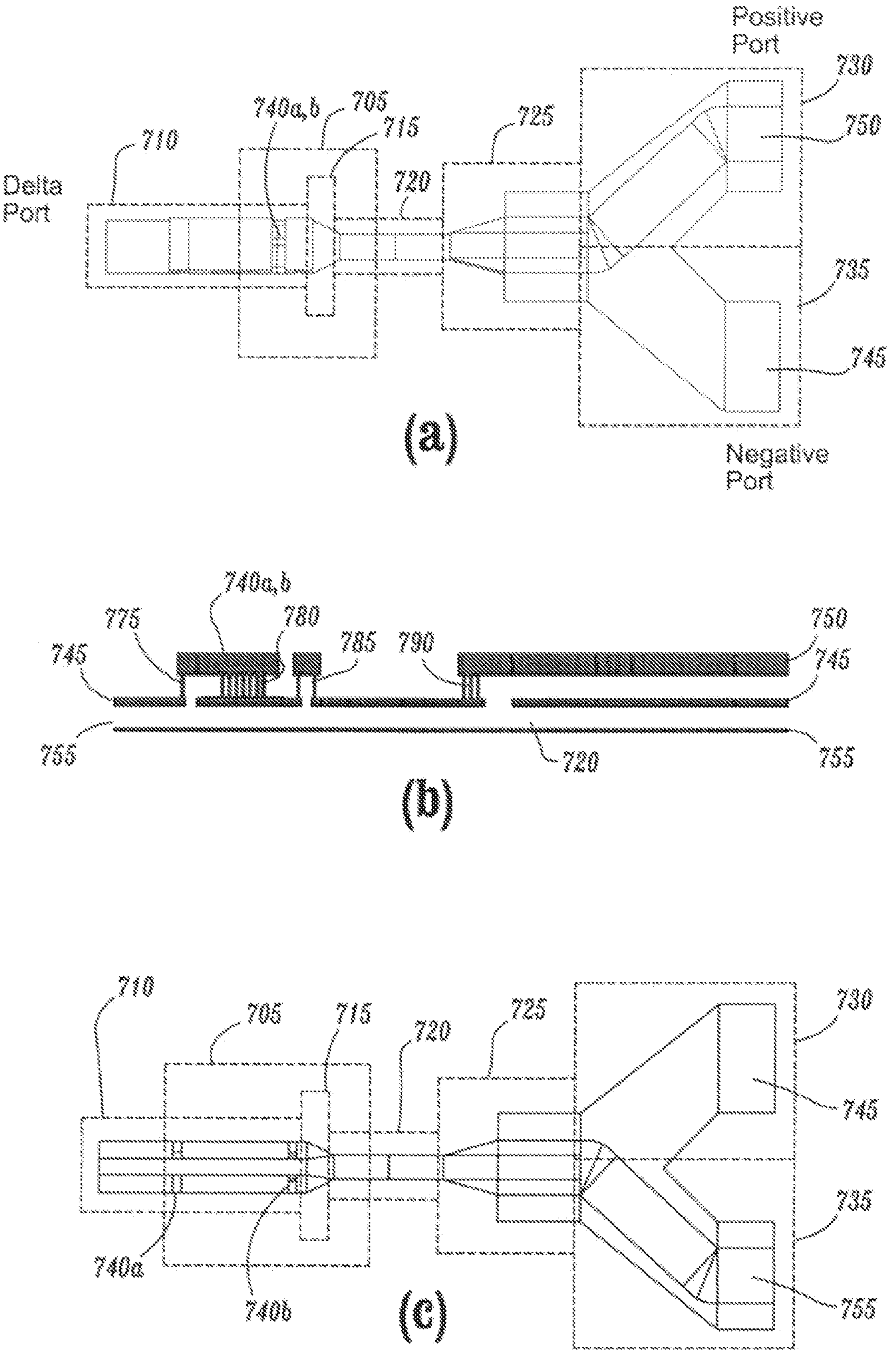
FIG. 7 illustrates a top, side and bottom view of an ultra-broadband balun structure having an inverted μS-to-balanced stripline-to-μS configuration according to another exemplary embodiment of the present invention.

FIG. 7 illustrates a top (a), side (b) and bottom (c) view of an ultra-broadband balun structure having an inverted μS-to-balanced stripline-to-μS configuration. As shown in FIG. 7, an ultra-broadband balun 705 includes a portion of an inverted unbalanced μS 710, a portion of a balanced stripline 720 and a transition 715. The balun 705 also includes a pair of capacitors 740*a,b* connected to the unbalanced μS 710. The balanced stripline 720 is connected via a split 725 to an unbalanced μS 730 and an inverted unbalanced μS 735. μS 730 includes a signal trace 750 positioned over the top of a ground plane 745 and the unbalanced μS 735 includes a signal trace 755 beneath the ground plane 745. In addition, several vias 775, 780, 785 and 790 are highlighted in the side view (b) to illustrate the connections between upper and lower level metal portions of the unbalanced μS 710, ground plane 745 and μSs 730 and 735, among others.

As further shown in FIG. 7, a signal is input to a signal trace via a delta port of the unbalanced μS 710 having an impedance of 50 ohms. This inversion is determined by the placement of the capacitor 740*a* (e.g., a MIM capacitor) that requires top-level metal to be used at both of its terminals to prevent dielectric damage during fabrication of an integrated circuit. Because the MIM capacitor 740*a* is connected to ground, the ground has top-level metal leading to the unbalanced μS 710. Then there is the transition 715 to the balanced stripline 720 having an impedance of 50 ohms. After a short length of the balanced stripline 720, there is the transition or split 725 to the two unbalanced μSs 730 and 735. The two unbalanced μSs 730 and 735 each have an impedance of 25 ohms and signals output from positive and negative ports thereof are now 180-degrees out of phase. In this implementation, outputs of the unbalanced μS 730 and 735 are inverted with respect to each other.

The balun structures of FIGS. 5-7 were simulated using a 2.5 dimensional (D) method-of-moments based simulator. Before discussing the simulation results, it should be understood that ideally one would like a balun whose outputs are well matched in amplitude and whose phases are offset by 180-degrees. In addition, one would ideally want a balun that has good return loss, for example, >10 dB, and a low insertion loss, for example, <0.5 dB.

Figure 8:
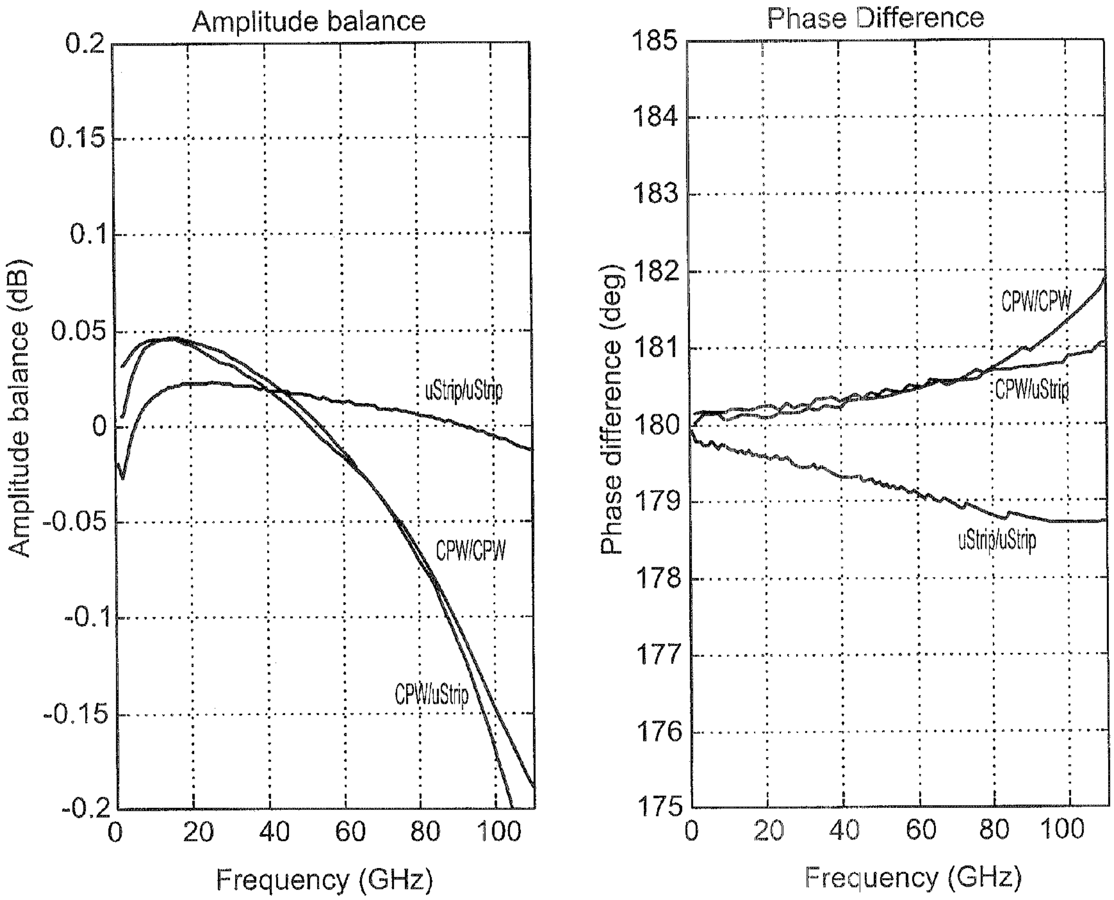
FIG. 8 is a pair of graphs illustrating amplitude balance and phase difference for the ultra-broadband balun structures of FIGS. 5-7.

FIG. 8 is a pair of graphs illustrating amplitude balance and phase difference for the balun structures of FIGS. 5-7. As shown in FIG. 8, the balun structures were simulated over a frequency range of 2-110 GHz. As can be observed, each balun structure provided better than 0.2 dB of amplitude balance while the phase difference was within 2-degrees of 180-degrees over the entire frequency range.

Figure 9:
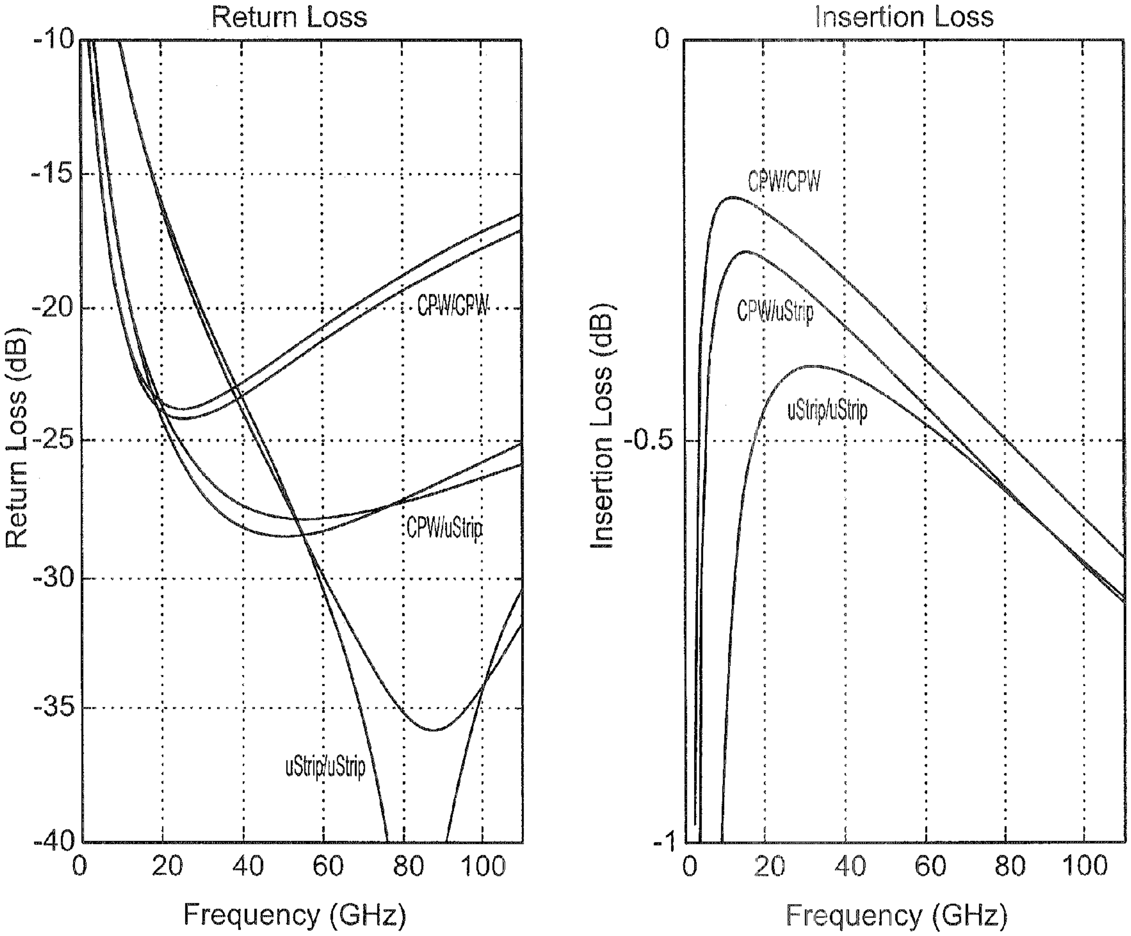
FIG. 9 is a pair of graphs illustrating return loss and insertion loss for the ultra-broadband balun structures of FIGS. 5-7.

FIG. 9 is a pair of graphs illustrating return loss and insertion loss for the ultra-broadband balun structures of FIGS. 5-7. As shown in FIG. 9, the positive and negative ports of the baluns have been converted into a differential port that has twice the characteristic impedance of its constituent ports. In this manner, insertion loss is determined with respect to summed power at the positive and negative ports. In addition, this differential conversion accurately portrays the output impedance of the unbalanced transmission lines, which, when driven differently, behave as a single balanced line. As a result, good results are obtained over a frequency range of 2-110 GHz. Further, the insertion loss is better than 0.5 dB for much of the frequency range and better than 0.7 dB for frequencies approaching 110 GHz. Such an insertion loss results in the outputs of the unbalanced transmission lines to have S21*s* and S31s around −3.5 dB, where port 1 is the delta port, port 2 is the positive port and port 3 is the negative port.

Figure 10:
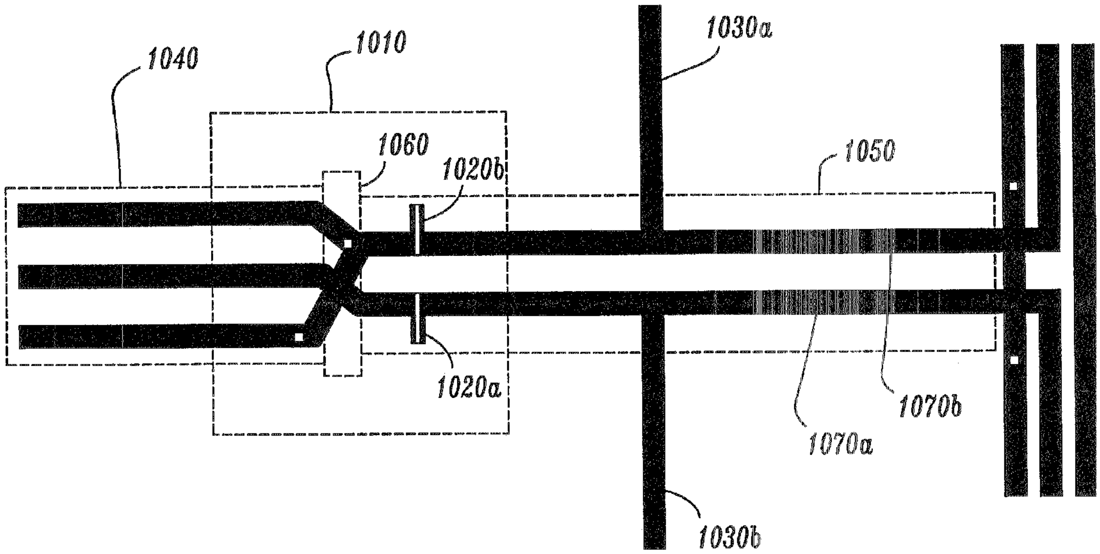
FIG. 10 is a diagram of an ultra-broadband balun structure including a bias-Tee according to yet another exemplary embodiment of the present invention.

FIG. 10 is a diagram of an ultra-broadband balun structure including a bias-Tee according to yet another exemplary embodiment of the present invention. As shown in FIG. 10, an ultra-broadband balun 1010 includes a portion of an unbalanced transmission line 1040, a portion of a balanced transmission line 1050 and a transition 1060. The balun 1010 also includes a pair of capacitors 1020*a,b*. The capacitors 1020*a,b* are connected to signal lines 1070*a,b*, respectively, of the balanced transmission line 1050, thus providing DC blocking for the signal lines 1070*a,b*. Also connected to the balanced transmission line 1050 is a pair of bias stubs 1030*a,b* forming a bias-tee. The bias stubs 1030*a,b* can be used as bias feeds and can be used for a variety of applications such as the biasing of a differential amplifier or a clock buffer. It is to be understood that one or both of the capacitors 1020*a,b* could be inserted in ground and signal traces of the unbalanced transmission line 1040 to prevent DC ground from being imposed on one or both of the balanced signal traces 1070*a,b*.

In accordance with an exemplary embodiment of the present invention, an on-chip ultra-broadband balun including an unbalanced to balanced transmission line transition where the grounds of the unbalanced line are attached to one of the balanced lines through capacitors is provided. The inclusion of the capacitors prevents DC ground from being imposed on one of the signal lines of the balanced transmission line. In addition, the balanced transmission line may then be optionally converted through another transition into two unbalanced lines whose signals are out of phase. This is useful if the balun will drive or is driven by a circuit whose inputs or outputs are located appreciably distant, for example, 80 μm, from one another with respect to the wavelength of a signal traversing the balun at, for example, 60 GHz.

The result is a balun that may be implemented within the back end of the line (BEOL) of a semiconductor manufacturing processes using metal and dielectric layers. The balun is therefore able to exploit multiple metal layers and the vias that connect them. This further enables the balun to exploit the high capacitance density devices thus resulting in a compact balun with a single-ended input and two outputs whose signals are 180-degrees out of phase and that can work over an extremely large bandwidth (e.g., 5-110 GHz) and is an impedance-controlled device. In addition, low insertion loss is attained due to the compact size of the balun.

It should be understood that the above description is only representative of illustrative embodiments. For the convenience of the reader, the above description has focused on a representative sample of possible embodiments, a sample that is illustrative of the principles of the invention. The description has not attempted to exhaustively enumerate all possible variations. That alternative embodiments may not have been presented for a specific portion of the invention, or that further undescribed alternatives may be available for a portion, is not to be considered a disclaimer of those alternate embodiments. Other applications and embodiments can be implemented without departing from the spirit and scope of the present invention.

It is therefore intended, that the invention not be limited to the specifically described embodiments, because numerous permutations and combinations of the above and implementations involving non-inventive substitutions for the above can be created, but the invention is to be defined in accordance with the claims that follow. It can be appreciated that many of those undescribed embodiments are within the literal scope of the following claims, and that others are equivalent.

What is claimed is:

1. A balun, comprising:

a first unbalanced transmission line comprising a first ground trace and a signal trace; and a balanced transmission line comprising a first and second signal trace, wherein the first signal trace of the balanced transmission line is connected to the first ground trace of the first unbalanced transmission line and the second signal trace of the balanced transmission line is connected to the signal trace of the first unbalanced transmission line, wherein a first capacitor is disposed in series with one of the first ground trace of the first unbalanced transmission line and the first signal trace of the balanced transmission line and the first capacitor prevents direct current (DC) ground from being imposed on the first signal trace of the balanced transmission line.

2. The balun of claim 1, wherein the first unbalanced transmission line is one of a microstrip and inverted microstrip.

3. The balun of claim 1, wherein the balanced transmission line is one of a balanced stripline and coplanar stripline.

4. The balun of claim 1, wherein the first capacitor is one of a metal-insulator-metal (MIM) capacitor, vertical parallel-plate capacitor, fringe capacitor, polysilicon capacitor and metal-oxide semiconductor (MOS) capacitor.

5. The balun of claim 1, wherein the first unbalanced transmission line and the balanced transmission line have the same impedance.

6. The balun of claim 1, wherein the first unbalanced transmission line further comprises:

a second ground trace, wherein the second ground trace is connected to the first signal trace of the balanced transmission line, wherein a second capacitor is disposed in series with the second ground trace when the first capacitor is disposed in series with the first ground trace.

7. The balun of claim 6, wherein the first unbalanced transmission line is one of a finite-ground coplanar waveguide (FGCPW), coplanar waveguide, coplanar stripline, asymmetric stripline, and slotline.

8. The balun of claim 6, wherein the first unbalanced and balanced transmission lines are capable of one of millimeter wave transmission and microwave transmission.

9. The balun of claim 6, wherein the second capacitor is one of a MIM capacitor, vertical parallel-plate capacitor, fringe capacitor, polysilicon capacitor and MOS capacitor.

10. The balun of claim 6, wherein the second capacitor prevents DC ground from being imposed on the first signal trace of the balanced transmission line.

11. An ultra-broadband balun circuit, comprising:

a first unbalanced transmission line comprising a first ground trace and a signal trace, a balanced transmission line comprising a first and second signal trace, wherein the first signal trace of the balanced transmission line is connected to the first ground trace of the first unbalanced transmission line and the second signal trace of the balanced transmission line is connected to the signal trace of the first unbalanced transmission line, wherein a first capacitor is disposed in series with one of the first ground trace of the first unbalanced transmission line and the first signal trace of the balanced transmission line;

a second unbalanced transmission line comprising a ground trace and a signal trace, wherein the signal trace of the second unbalanced transmission line is connected to the first signal trace of the balanced transmission line; and a third unbalanced transmission line comprising a ground trace and a signal trace, wherein the signal trace of the third unbalanced transmission line is connected to the second signal trace of the balanced transmission line, wherein an impedance of each of the second and third transmission lines is half an impedance of the first unbalanced transmission line or the balanced transmission line.

12. The circuit of claim 11, wherein a signal output from the second unbalanced transmission line is about 180-degrees out of phase with a signal output from the third unbalanced transmission line.

13. The circuit of claim 11, wherein the first unbalanced transmission line is one of a microstrip and inverted microstrip.

14. The circuit of claim 11, wherein the second and third unbalanced transmission lines are each one of a finite-ground coplanar waveguide (FGCPW), coplanar waveguide, coplanar stripline, asymmetric stripline, microstrip, inverted microstrip and slotline capable of one of millimeter wave transmission and microwave transmission.

15. The circuit of claim 11, wherein the balanced transmission line is one of a balanced stripline and coplanar stripline capable of one of millimeter wave transmission and microwave transmission.

16. The circuit of claim 11, wherein power output from each of the second and third transmission lines is the same.

17. The circuit of claim 11, wherein the first unbalanced transmission line further comprises:

a second ground trace, wherein the second ground trace is connected to the first signal trace of the balanced transmission line, wherein a second capacitor is disposed in series with the second ground trace when the first capacitor is disposed in series with the first ground trace.

18. The circuit of claim 17, wherein the first unbalanced transmission line is one of an FGCPW, coplanar waveguide, coplanar stripline, asymmetric stripline, and slotline.

19. The circuit of claim 17, wherein the first and second capacitors are each one of a metal-insulator-metal (MIM) capacitor, vertical parallel-plate capacitor, fringe capacitor, polysilicon capacitor and metal-oxide semiconductor (MOS) capacitor.

20. An ultra-broadband balun circuit, comprising:

a first unbalanced transmission line comprising a first ground trace and a signal trace; and a balanced transmission line comprising a first and second signal trace, wherein a first capacitor is disposed in series with the first signal trace and a second capacitor is disposed in series with the second signal trace and a first bias stub is connected to the first signal trace and a second bias stub is connected to the second signal trace, wherein the first signal trace is connected to the first ground trace of the first unbalanced transmission line and the second signal trace is connected to the signal trace of the first unbalanced transmission line.

21. The circuit of claim 20, further comprising:

a second unbalanced transmission line comprising a ground trace and a signal trace, wherein the signal trace of the second unbalanced transmission line is connected to the first signal trace of the balanced transmission line; and a third unbalanced transmission line comprising a ground trace and a signal trace, wherein the signal trace of the third unbalanced transmission line is connected to the second signal trace of the balanced transmission line.

22. The circuit of claim 21, wherein the second and third unbalanced transmission lines are each one of a FGCPW, coplanar waveguide, coplanar stripline, microstrip, inverted microstrip and slotline.

23. The circuit of claim 20, wherein the first unbalanced transmission line further comprises:

a second ground trace connected to the first signal trace of the balanced transmission line.

24. The circuit of claim 23, wherein the first transmission line is one of a FGCPW, coplanar waveguide, coplanar stripline, asymmetric stripline, and slotline.

25. The circuit of claim 20, wherein the fist and second bias stubs form a bias-tee.

26. The circuit of claim 20, wherein the first unbalanced transmission line is one of a microstrip and inverted microstrip.

27. The circuit of claim 20, wherein the balanced transmission line is one of a balanced stripline and coplanar stripline.

28. The circuit of claim 20, wherein the first and second capacitors are each one of a metal-insulator-metal (MIM) capacitor, vertical parallel-plate capacitor, fringe capacitor, polysilicon capacitor and metal-oxide semiconductor (MOS) capacitor.

29. The circuit of claim 20, wherein the first and second bias stubs provide a direct current (DC) connection to the first and second signal traces of the balanced transmission line.

* * * * *